United States Patent
Hale et al.

(10) Patent No.: US 6,325,351 B1
(45) Date of Patent: Dec. 4, 2001

(54) HIGHLY DAMPED KINEMATIC COUPLING FOR PRECISION INSTRUMENTS

(75) Inventors: Layton C. Hale; Steven A. Jensen, both of Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/478,143

(22) Filed: Jan. 5, 2000

(51) Int. Cl.$^7$ .................................. F16M 13/00
(52) U.S. Cl. ............... 248/562; 52/167.4; 52/167.5; 248/603; 248/636; 248/638; 248/663
(58) Field of Search ................... 248/603, 550, 248/562, 636, 638, 632, 559, 663, 560; 52/167.3–167.6, 167.1

(56) References Cited

U.S. PATENT DOCUMENTS

| | | | |
|---|---|---|---|
| 3,906,689 | * | 9/1975 | Nakayama ........................ 52/167 |
| 4,496,130 | * | 1/1985 | Toyama .............................. 248/585 |
| 4,917,211 | * | 4/1990 | Yamada et al. .................. 181/0.5 |
| 5,310,017 | * | 5/1994 | Tobias ............................... 180/291 |
| 5,533,307 | * | 7/1996 | Tsai et al. ........................ 52/167.3 |
| 5,642,956 | * | 7/1997 | Hale ................................... 403/122 |
| 5,689,919 | * | 11/1997 | Yano ................................ 52/167.6 |
| 5,763,965 | * | 6/1998 | Bader ................................ 310/12 |

OTHER PUBLICATIONS

T.A. Decker et al.; "Highly–damped exactly–constrained mounting of an x–ray telescope"; SPIE vol. 2445, Mar. 1995.

Hale, Layton C. "Principles and Techniques for Designing Precision Machines" Doctor of Philosophy Thesis, Massachusetts, Institute of Technology, Feb. 1999.

* cited by examiner

*Primary Examiner*—Ramon O. Ramirez
*Assistant Examiner*—Tan Le
(74) *Attorney, Agent, or Firm*—L. E. Carnahan; Alan H. Thompson

(57) ABSTRACT

A highly damped kinematic coupling for precision instruments. The kinematic coupling provides support while causing essentially no influence to its nature shape, with such influences coming, for example, from manufacturing tolerances, temperature changes, or ground motion. The coupling uses three ball-cone constraints, each combined with a released flexural degree of freedom. This arrangement enables a gain of higher load capacity and stiffness, but can also significantly reduce the friction level in proportion to the ball radius divided by the distance between the ball and the hinge axis. The blade flexures reduces somewhat the stiffness of the coupling and provides an ideal location to apply constrained-layer damping which is accomplished by attaching a viscoelastic layer and a constraining layer on opposite sides of each of the blade flexures. The three identical ball-cone flexures provide a damped coupling mechanism to kinematically support the projection optics system of the extreme ultraviolet lithography (EUVL) system, or other load-sensitive apparatus.

16 Claims, 2 Drawing Sheets

HIGHLY DAMPED KINEMATIC COUPLING FOR PRECISION INSTRUMENTS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to kinematic couplings, particularly to a kinematic coupling for precision instruments, and more particularly to a highly damped kinematic coupling for precision instruments which utilizes three ball-cone constraints each combined with a released flexural degree of freedom and which include constrained-layer damping.

Load-sensitive apparatus, such as the projection optics system for extreme ultraviolet lithography (EUVL) requires precise alignment of the reflective optics within the structural housing. It is critical that the housing be isolated from variable loads that could change the optical alignment. Such loads could arise from being mounted to other structures in an overconstrained manner. Each constraint of the six rigid-body degrees of freedom may be achieved approximately with a kinematic coupling. Kinematic couplings have long been used for the purpose of repeatable location and minimal influence to the supported object. Friction present in the contacting surfaces of a typical kinematic coupling, for example, a three-vee coupling, introduces small but uncertain forces that distort the object being supported. In addition, the typical kinematic coupling provides very little damping at low excitation levels.

The present invention provides the same kinematics as the three-vee coupling by using three ball-cone constraints each combined with a released flexural degree of freedom. This three ball-cone arrangement enables higher load capacity and stiffness, but can also significantly reduce the friction level in proportion to the ball radius divided by the distance between the ball and the hinge axis. The coupling of this invention also utilizes blade flexures which reduce somewhat the stiffness of the coupling and provides an ideal location to apply constrained-layer damping, which includes a viscoelastic layer and a constraining layer on opposite sides of the two blade flexures of the coupling. Constrained-layer damping has been previously utilized as a damping treatment across flexures of kinematic couplings, see "Highly-Damped Exactly-Constrained Mounting Of An X-Ray Telescope," P. S. Wilke et al., SPIE, Vol. 2445, Passive Damping, March 1995. It is reasonable to achieve one to two orders of magnitude reduction in the vibrational amplitude with the coupling arrangement of the present invention.

SUMMARY OF THE INVENTION

It is an object of the present invention to provide an improved kinematic coupling arrangement.

A further object of the invention is to provide a highly damped kinematic coupling for precision instruments.

A further object of the invention is to provide a kinematic coupling using ball-cone constraints and constrained-layer damping.

Another object of the invention is to provide a kinematic coupling using three ball-cone constraints each combined with a released flexural degree of freedom.

Another object of the invention is to provide a kinematic coupling using ball-cone constraints having blade flexures to which a constrained layer damping treatment is applied.

Another object of the invention is to provide a coupling using ball-cone constraints which include damped blade flexures on each side of which is mounted a viscoelastic layer and a constraining layer to provide dampening of the coupling.

Other objects and advantages of the present invention will become apparent from the following description and accompanying drawings. The present invention involves a highly damped flexure mechanism utilizes three identical damped flexures to kinematically support a load-sensitive apparatus, such as the projection optics system of an EUVL system. The invention is a highly damped kinematic coupling utilizing three ball-cone constraints, each using blade flexures to which is applied constrained-layer damping. The ball-cone constraints enable higher load capacity and stiffness, while significantly reducing the friction level. The friction level is reduced in proportion to the ball radius divided by the distance between the ball and the hinge axis. The constrained-layer damping achieves one to two orders of magnitude reduction in the vibration amplitude. While this invention has particular application as a support for the projection optics system of the EUVL, it may be used in other optical and precision systems requiring an exact-constraint mount that adds significant damping to the system.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to a highly damped kinematic coupling which address the need to support a very precise instrument while causing essentially no influence to its natural shape. The invention provides a damped flexure mechanism utilizes three identical damped flexures to kinematically support load-sensitive apparatus, such as the projection optics system for the EUVL system.

The projection optics system for EUVL requires, as pointed out above, precise alignment of the reflective optics within the structural housing. It is critical that the housing be isolated from variable loads that could change the optical alignment. Such loads could arise from being mounted to other structures in an overconstrained manner. Exact constraint of the six rigid-body degrees of freedom is achieved approximately with a kinematic coupling (e.g. three ball-vee constraints) if friction forces present at the contacting surfaces are less than the variable loads that the housing will tolerate. For example, the projection optics system weighs about 450 lbs. and the friction at any constraint could easily be up to 20 lbs. By comparison, the friction force using the ball-cone arrangement of this invention would be 4 to 5 times less (4 to 5 lbs.).

In addition to concern over quasi static variable loads on the housing, the dynamic response of the projection optics system is also very demanding. The mount must be stiff to achieve sufficiently high resonant frequencies (>100 Hz) and if possible provide moderate damping (>5% critical) to reduce amplification at resonance. Together, these traits reduce the vibration amplitude of the optics caused by random ground motion transmitted through the vibration isolators. A further benefit of the ball-cone joint used to increase stiffness is much lower contact stress than is typical of other kinematic couplings. This allows the use of super invar, which has a very low coefficient of thermal expansion but cannot be hardened beyond its annealed state.

Figure 1:
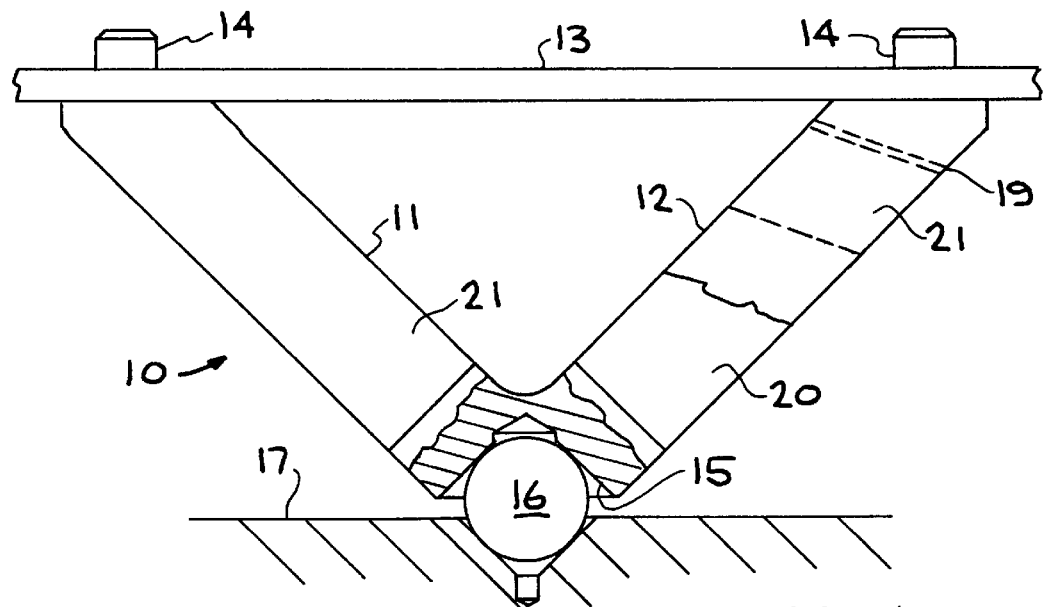
FIG. 1 is a side view of an embodiment of the damped flexure of the invention, as taken along the line 1—1 of FIG. 3 with a section shown in cross-section.
Figure 2:
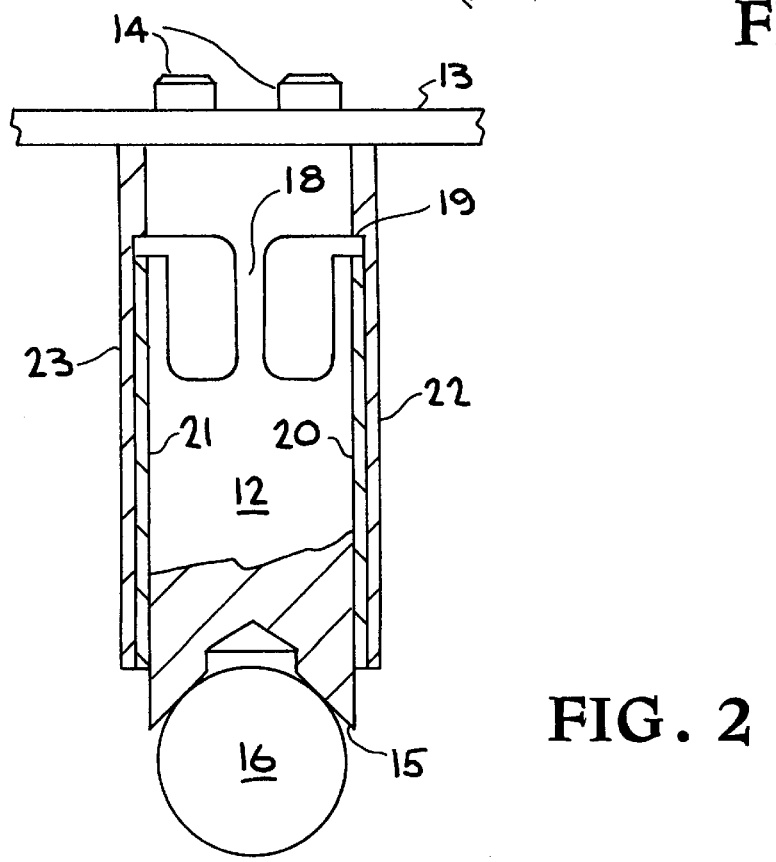
FIG. 2 is a partial cross-sectional view of a leg of the FIG. 1 damped flexure.
Figure 3:
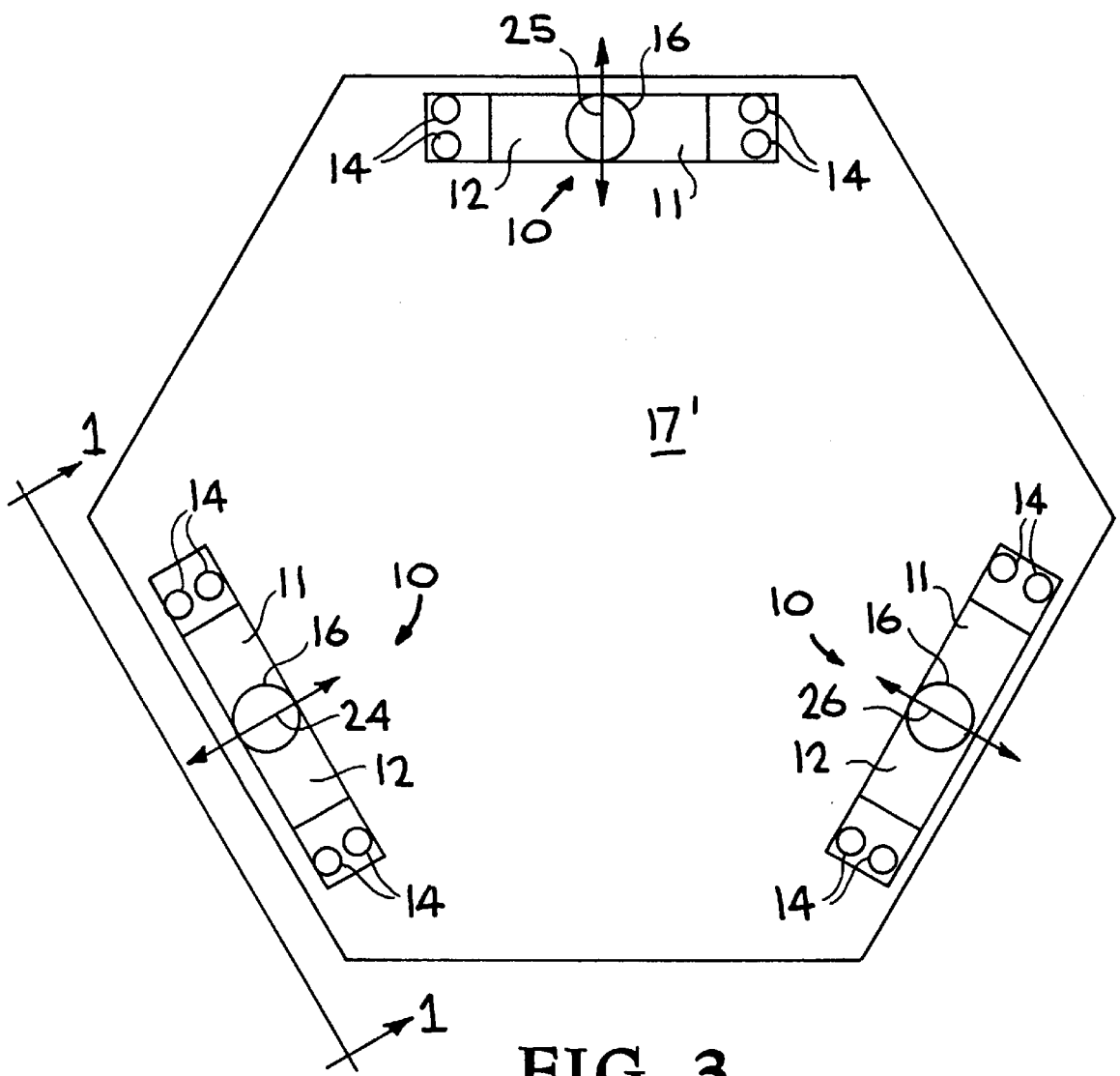
FIG. 3 illustrates a top view of a mounting arrangement for the damped flexures of FIG. 1.

FIG. 1 shows an embodiment of the damped flexure mechanism that is the main component of this invention, which requires three identical damped flexures to kinematically support the projection optics system or other load-sensitive apparatus. FIG. 2 illustrates one leg of the flexure of FIG. 1 showing the blade flexure and the constrained-layer damping arrangement described in greater detail hereinafter. The three flexures of the coupling of the present invention are attached to a housing which is to be mounted on a support member, as shown in FIG. 3, and are each supported by a ball assumed to be fixed in space. The reverse arrangement could be implemented without consequence. The ball-cone interface allows three rotational degrees of freedom about the ball center. A pair of blade flexures (one in each leg) provides an additional hinge axis that in combination with the ball-cone joint releases one translational constraint. The remaining two translational constraints are equivalent to those provided by a ball-vee interface typical of a three-vee kinematic coupling. The advantages of the ball-cone interface over the ball-vee interface are lower contact stress, higher stiffness and lower friction due to its small radius compared to the separation between the ball and hinge axis. Further improvements can be made by curvature matching, i.e., shaping the cone to have a curved cross section that nearly matches the ball. However, the main compliance source typically is the flexure. There is a design compromise between the need for sufficient bending compliance and the desire for rigid axial constraint. This compromise is improved by making the blade flexures wider and increasing the separation distance between the ball and the hinge axis.

FIG. 2 shows a constrained-layer damping treatment applied in parallel (structurally) with the blade flexure so that the load path divides, the majority passing through the flexure and the remainder passing through the damper. In practice, the damping treatment is applied symmetrically to both sides of both legs. The damper consists of a constraining layer in series with a thin viscoelastic layer. The constraining layer being much stiffer than the viscoelastic layer causes primarily shear deformation across the viscoelastic layer when the damper transmits any load. The effective stiffness of the viscoelastic layer is optimized in proportion to the blade flexure and constraining layer so that the maximum strain energy will reside in the viscoelastic layer, hence maximizing the energy lost per cycle of vibration. The damping ability of any particular viscoelastic material varies as a function of temperature and frequency. As different types are commercially available, it is important to select one that will perform best in the temperature/frequency region anticipated for the damping treatment. By way of example the viscoelastic material may be composed of an ultra pure viscoelastic damping polymer, such as 3M Scotchdamp 242, manufactured by 3M Bonding Systems Division, St. Paul, Minn.

This damped flexure system was tested using experimental modal analysis to ascertain the level of damping both before and after applying the damping treatment. The damping treatment was optimized for the first two modes, which have modal frequencies of 122 and 130 Hz, respectively. Without the damping treatment, the level of damping was measured at 1.1% and 0.32% of critical damping. With the damping treatment, the level of damping increased to 8.4% and 7.0% of critical damping. While these are good results, factors of 2 to 3 better are quite realistic.

Referring now to FIG. 1, in which a damped flexure mounted to a housing surface and which provides stiff, moderately damped constraint along each leg of the flexure. As shown, a damped flexure, generally indicated at 10, of a v-shape includes two legs 11 and 12 which are secured to a housing 13, such as the above-referenced projection optics box, by connectors, such as bolts 14 which are threaded into opening in each leg. Flexure 10 is provided with a cone-shaped cutaway 15 in which a support ball 16 is positioned to form a ball-cone joint of legs 11 and 12, and ball 16 is adapted to contact a support surface 17 for the housing 13. Each leg 11 and 12, as seen in FIG. 2, includes a flexure blade or member 18 defining a slit 19 (see FIG. 1), viscoelastic layers 20 and 21, and constraining layers 22 and 23.

FIG. 3 illustrate a top view of a support arrangement, such as for housing 13 of FIG. 1 mounted on a surface such as surface 17 of FIG. 1 and indicated at 17'. In this embodiment, three damped flexures 10 are mounted to a housing, not shown, by bolts 14 such that the balls 16 are in contact with a surface 17'. The damped flexures 10 provide flexural freedom in the directions indicated by arrows 24, 25, and 26. Each damped flexure 10 provides stiff, moderately damped constraint along each leg 11 and 12, and releases one degree of freedom so the ball-cone joint (15–16) will fully seat without overconstraint.

By way of example, the damping treatment illustrated in the FIGS. 1 and 2 embodiment, has viscoelastic layers 20 composed of 3M Scotchdamp 242 having a thickness of 0.003 to 0.006 inch, and the constraining layers 21 composed of stainless steel having a thickness of 0.004 to 0.04 inch, and the ball 16 may have a diameter of 0.75 inch.

It has thus been shown that the present invention satisfied the need to support a very precise instrument while causing essentially no influence to its natural shape. This invention provides the same kinematics as a three-vee coupling by using three ball-cone constraints each combined with a released flexural degree of freedom. The ball-cone arrangement, rather than the ball-vee arrangement, significantly reduces the friction level in proportion to the ball radius divided by the distance between the ball and the hinge axis. The damping treatment (visoelastic and constraining layers) significantly increases the level of damping.

While a particular embodiment of the invention has been illustrated and described, along with materials and parameters, to exemplify and teach the principles of the invention, such are not intended to be limiting. Modifications and changes may become apparent to those skilled in the art, and it is intended that the invention be limited only by the scope of the amended claims.

What is claimed is:

1. A damped flexure mechanism, comprising:
   a flexure member,
   said flexure member having a pair of legs interconnected at one end,
   each of said legs having means for mounting to an associated surface, each of said legs including at least one blade flexure, a cone-shaped area located in the interconnected ends of said legs, a ball located in said cone-shaped area, and means for damping mounted to each of said legs, said means comprising a damper consisting of a single constraining layer in series with a viscoelastic layer, said constraining layer extending around at least a portion of said viscoelastic layer.

2. The mechanism of claim 1, wherein a viscoelastic layer and a constraining layer is mounted on opposite sides of each said legs.

3. The mechanism of claim 1, wherein a viscoelastic layer is constructed of an ultra pure viscoelastic damping polymer.

4. The mechanism of claim 3, wherein said viscoelastic layers has a thickness in the range of about 0.003 to about 0.006 inch.

5. The mechanism of claim 1, wherein said constraining layer is constructed of stainless steel.

6. The mechanism of claim 5, wherein said constraining layer has a thickness of about 0.004 to 0.04 inch.

7. A damped kinematic coupling, comprising:

a damped flexure, said flexure having legs interconnected to define a V-shape, a cone-shaped cutaway located at a point of interconnection of said legs, a ball position in said cone-shape cutaway, and a constrained-layer damping arrangement mounted to each of said legs and consisting of a single constraining layer in series with a viscoelastic layer, said constraining layer extending around at least a portion of said viscoelastic layer.

8. The coupling of claim 7, additionally including at least one blade flexure in each leg.

9. The coupling of claim 7, additionally including means for connecting said legs to a point of use.

10. The coupling of claim 7, wherein a constrained-layer damping arrangement is located on opposite sides of each of said legs.

11. The coupling of claim 10, wherein each constrained-layer damping arrangement consists of a viscoelastic layer and a constraining layer.

12. The coupling of claim 11, wherein said constraining layer is located exterior of said viscoelastic layer.

13. A highly damped kinematic coupling for precision instruments, comprising:

three damped flexures, each flexure including a plurality of legs, and a ball-cone joint, each flexure including at least one constrained-layer damping arrangement mounted to each of said legs, and each of said legs including means for mounting said flexure to an associated instrument, said at least one constrained-layer damping arrangement consists of a single constraining layer in series with a viscoelastic layer, said constraining layer extending around at least a portion of said viscoelastic layer.

14. The coupling of claim 13, wherein said legs of each of said flexures being interconnected to form a vee, said ball-cone joint being located at said thus formed vee.

15. The coupling of claim 13, wherein a constrained-layer damping arrangement is mounted of opposite sides of each of said legs.

16. The coupling of claim 13, additionally including at least one blade flexure in each leg.

* * * * *